(12) United States Patent
Harimoto et al.

(10) Patent No.: US 8,211,993 B2
(45) Date of Patent: *Jul. 3, 2012

(54) INORGANIC SUBSTRATE WITH A THIN SILICA TYPE GLASS LAYER, METHOD OF MANUFACTURING THE AFOREMENTIONED SUBSTRATE, COATING AGENT, AND A SEMICONDUCTOR DEVICE

(75) Inventors: Yukinari Harimoto, Hadano (JP); Maki Itoh, Tokyo (JP); Dimitris Elias Katsoulis, Midland, MI (US)

(73) Assignees: Dow Corning Toray Company, Ltd., Chiyoda-ku, Tokyo (JP); Dow Corning Corporation, Midland, MI (US)

( * ) Notice: Subject to any disclaimer, the term of this patent is extended or adjusted under 35 U.S.C. 154(b) by 606 days.

This patent is subject to a terminal disclaimer.

(21) Appl. No.: 12/090,694

(22) PCT Filed: Oct. 23, 2006

(86) PCT No.: PCT/JP2006/321587
§ 371 (c)(1),
(2), (4) Date: Aug. 6, 2009

(87) PCT Pub. No.: WO2007/046560
PCT Pub. Date: Apr. 26, 2007

(65) Prior Publication Data
US 2009/0293942 A1 Dec. 3, 2009

(30) Foreign Application Priority Data
Oct. 21, 2005 (JP) .................................. 2005-306720

(51) Int. Cl.
*C08G 77/12* (2006.01)
*B05D 5/06* (2006.01)

(52) U.S. Cl. ................ 528/31; 106/287.14; 106/287.34; 427/167

(58) Field of Classification Search .................. 528/31; 106/287.14; 428/426, 432; 427/397.7, 377, 427/496
See application file for complete search history.

(56) References Cited

U.S. PATENT DOCUMENTS
2,895,853 A * 7/1959 York et al. ................. 427/387
(Continued)

FOREIGN PATENT DOCUMENTS
EP 0479452 A2 4/1992
(Continued)

OTHER PUBLICATIONS

English language abstract for JP 54149489 extracted from PAJ database, dated Nov. 24, 2008, 7 pages.
English language translation and abstract for JP 10286907 extracted from PAJ database, dated Nov. 24, 2008, 27 pages.
(Continued)

*Primary Examiner* — Robert S Loewe
(74) *Attorney, Agent, or Firm* — Howard & Howard Attorneys PLLC (57) ABSTRACT

A method of manufacturing an inorganic substrate coated with a thin silica type glass layer of 2H to 9H pencil hardness, said method comprising the steps of: coating an inorganic substrate with a cyclic dihydrogenpolysiloxane and/or a hydrogenpolysiloxane represented by a specific unit formula, and curing it; an inorganic substrate coated with a thin silica type glass layer; a coating agent for an inorganic substrate that is composed of a cyclic dihydrogenpolysiloxane and/or a hydrogenpolysiloxane represented by a specific unit formula; and a semiconductor device having an inorganic substrate coated with a thin silica type glass layer.

13 Claims, 1 Drawing Sheet

U.S. PATENT DOCUMENTS

| | | | | |
|---|---|---|---|---|
| 3,992,426 A | * | 11/1976 | Johnson et al. | 556/451 |
| 4,565,714 A | * | 1/1986 | Koshar | 427/515 |
| 4,999,397 A | | 3/1991 | Weiss et al. | |
| 5,010,159 A | | 4/1991 | Bank et al. | |
| 5,063,267 A | | 11/1991 | Hanneman et al. | |
| 5,091,162 A | * | 2/1992 | Frye et al. | 423/325 |
| 5,436,029 A | | 7/1995 | Ballance et al. | |
| 6,143,360 A | * | 11/2000 | Zhong | 427/244 |
| 2003/0171477 A1 | * | 9/2003 | Baba et al. | 524/492 |

FOREIGN PATENT DOCUMENTS

| | | |
|---|---|---|
| EP | 0579456 A2 | 1/1994 |
| JP | 54149489 A | 11/1979 |
| JP | 10286907 A | 10/1998 |
| JP | 2000260570 A | 9/2000 |
| JP | 2000323732 A | 11/2000 |
| JP | 2001011611 A | 1/2001 |
| JP | 2003179238 A | 6/2003 |
| JP | 2003318119 A | 11/2003 |
| JP | 2005079405 A | 3/2005 |
| WO | WO 2007018283 A1 | 2/2007 |

OTHER PUBLICATIONS

English language translation and abstract for JP 2000260570 extracted from PAJ database, dated Nov. 24, 2008, 41 pages.

English language translation and abstract for JP 2000323732 extracted from PAJ database, dated Nov. 24, 2008, 35 pages.

English language translation and abstract for JP 2001011611 extracted from PAJ database, dated Nov. 24, 2008, 40 pages.

English language translation and abstract for JP 2003179238 extracted from PAJ database, dated Nov. 24, 2008, 48 pages.

English language translation and abstract for JP 2003318119 extracted from PAJ database, dated Nov. 24, 2008, 43 pages.

English language translation and abstract for JP 2005079405 extracted from PAJ database, dated Nov. 24, 2008, 38 pages.

PCT International Search Report for PCT/JP2006/321587, dated Jul. 5, 2007, 4 pages.

Seyferth et al. "Cyclic Polysiloxanes from the Hydrolysis of Dichlorosilane", American Chemical Society, vol. 22, 1983, pp. 2163-2167.

* cited by examiner

INORGANIC SUBSTRATE WITH A THIN SILICA TYPE GLASS LAYER, METHOD OF MANUFACTURING THE AFOREMENTIONED SUBSTRATE, COATING AGENT, AND A SEMICONDUCTOR DEVICE

RELATED APPLICATIONS

This application claims priority to and all the advantages of International Patent Application No. PCT/JP2006/321587, filed on Oct. 23, 2006, which claims priority to Japanese Patent Application No. JP2005-306720 filed on Oct. 21, 2005.

TECHNICAL FIELD

The present invention relates to an inorganic substrate with a thin silica type glass layer, a method of manufacturing the aforementioned substrate, a coating agent comprising a cyclic dihydrogenpolysiloxane (A) and/or a hydrogenpolysiloxane (B), and a semiconductor device obtained by forming at least a semiconductor layer on the aforementioned inorganic substrate with a thin silica type glass layer.

BACKGROUND ART

Substrates that are intended for supporting electrode layers of semiconductor devices such as solar batteries, semiconductor layers, light-emitting layers, etc., have to possess such basic characteristics as resistance to deformations, strains, or property deterioration under the effect of high temperatures inherent in processes for the formation of light-emitting layers.

They also should have precision surface flatness, stability against deformations that may be caused by humidity of air, exhibit prevention of such defects as pinholes in the semiconductor films, demonstrate resistance to buckling, peeling, breaking, etc. Substrates known heretofore that could satisfy such requirements are those made from glass and ceramic.

However, from the viewpoint of cost efficiency, versatility, and weight reduction of current electronic and semiconductor devices, attention is drawn nowadays to thin-film semiconductor elements and devices used in thin-film type solar batteries, thin-film transistors (TFT) for reflection-type liquid crystal displays, thin-film electroluminescent displays, or the like. A demand exists for highly efficient thin-film type solar batteries, and one especially important problem in this connection is the need to decrease in weight of solar batteries intended for use in space satellites.

For example, the following is stated in Japanese Examined Patent Application Publication [Kokoku] H4-63551: "Japanese Unexamined Patent Application Publication [hereinafter referred to as "JP Kokai"] S54-149489 discloses a solar battery that utilizes a substrate made from a thin polyimide resin film.

A disadvantage of such thin polyimide resin film is that it is deformed and cannot be uniformly heated at the high temperatures of deposition processes. Therefore, thin-film solar batteries have been developed with photovoltaic element layers of an amorphous silicon on a thin resin film, e.g., of polyimide that is highly resistant to heat and deformation and is formed on a metal foil."

The following is stated in JP Kokai H10-286907: "When a thin layer of a polyimide resin is formed on the surface of a thin metal plate, and pinholes are developed under the effect of such defects as irregularities on the surface of the thin metal plate, in order to prevent development of the pinholes the plate has to be polished. Introduction of this additional process increases the production cost. In order to solve this problem, a heat-resistant flexible substrate that was composed of a thin metal plate with a polyimide film applied onto it via an epoxy resin type adhesive was invented. Such a substrate finds application in solar batteries, reflection-type liquid crystal displays, electroluminescent displays, or similar thin-film type semiconductor devices."

The following statement is contained in JP Kokai 2000-323732: "A thin semiconductor layer (photoelectric conversion layer) can be formed at temperatures exceeding 400° C. on a substrate composed of a conductive sheet of stainless steel, aluminum, or the like, the surface of which and the inner peripheral surface of connecting holes formed in the plate are coated with an insulating layer of a polyimide resin, aramid resin, or a similar heat-resistant polymer."

As it follows from JP Kokai 2003-179238: "A thin-film CIS-type solar battery is produced by forming an electrode film on a flexible substrate (made., e.g., from stainless steel or polyimide) or on a substrate having a $SiO_2$ film, forming on said electrode film another thin film that contains an Ib group element (e.g., Cu, IIIb group element (e.g., In), and VI group element (e.g., Se), and then forming a semiconductor film (an light-absorbing layer) by subjecting the unit to heat treatment at a temperature within the range of 500 to 600° C."

Claims of JP Kokai 2005-79405 relate to a stainless steel foil coated with a silica-based inorganic polymer film consisting mainly of siloxane bonds, as well as to a stainless steel foil coated with a silica-based inorganic polymer film having a recessed and projected structure on the surface of the silica-based inorganic polymer film, wherein at least a part of the Si that constitutes the silica-based inorganic polymer film is chemically bonded with one or both of an organic radical and hydrogen. The claims also relate a thin-film silicon type solar battery utilizing the aforementioned coated foil as a substrate.

Practical examples of the aforementioned patent application describe only stainless steel foil coated with an organosilicon polymer having a recessed and projected structure of a submicron level and obtained by coating a stainless steel foil with a tetraethoxytitanium and dimethylsiloxane carbinol-modified at both molecular terminals or with a sol-like product of a reaction between a polymethylphenylsiloxane and water with subsequent thermal curing of the coating. A comparative example discloses a stainless steel foil coated with an insulating film obtained by preparing an aqueous solution of a tetraethoxytitanium and tetramethoxysilane, applying the solution onto a stainless steel foil, and thermally curing the coating.

JP Kokai 2000-260570 states that "a thin-film EL element can be obtained by heat-treating, at a temperature above 600° C., a structure composed of a substrate capable of withstanding a temperature exceeding 600° C. (e.g., of alumina or mullite), a conductive electrode layer (e.g., of an impurity-doped silicon), and a light-generating layer (e.g., of ZnS, SrS:Ce).

JP Kokai 2003-318119 discloses "a thin-film transistor for use in a liquid-crystal display unit, where the aforementioned thin-film transistor is produced by applying an optically-curable silane onto a substrate (made, e.g., of quartz), exposing the coating to light through an image pattern, forming a higher silane, and forming the thin-film transistor by heat-treating the higher silane at a temperature of about 550° C."

JP Kokai 2001-011611 describes "a process of obtaining a positive electrode of a thin lithium cell ($LiMn_2O_4$) by successively sputtering manganese trioxide onto a film substrate (e.g., stainless steel SUS304) for forming a thin film of β-manganese dioxide at a temperature below 400° C., vapor depositing lithium at a 400° C., and vapor-depositing β-manganese dioxide for the second time for obtaining the aforementioned $LiMn_2O_4$."

However, all the above described substrates (i.e., a substrate made from polyimide; a substrate composed of a metal foil coated with a thin heat-resistant resin film such as a polyimide film; a heat-resistant flexible substrate composed of a thin metal plate coated with a layer of a polyimide film attached through an epoxy type adhesive agent; a substrate composed of a thin metal plate, e.g., of stainless steel or aluminum the surface of which is coated with an electroinsulating layer of heat-resistant polymer such as polyimide or aramid resin; and a stainless steel foil coated with an organosilicon polymer having a recessed and projected structure of a submicron level and obtained by coating a stainless steel foil with a tetraethoxytitanium and dimethylsiloxane carbinol-modified at both molecular terminals or with a sol-like product of a reaction between a polymethylphenylsiloxane and water with subsequent thermal curing of the coating) utilize an organic resin, such as a polyimide resin, aramid resin, or organosilicon polymer as their structural material, and therefore at the high temperatures required for the formation of electrode layers, semiconductor layers, light-emitting layers, etc., such substrates are subject to damage and deformation.

At first glance, the surfaces of inorganic and metal substrate made, e.g., from stainless steel, aluminum, alumina, and mullite look smooth. On a microscopic level, however, these surfaces have irregularities and holes, and therefore, when they are coated with thin electrode layers, semiconductor layers, light-emitting layers, etc., the coating acquires a non-uniform thickness and a problem occurs in connection with the fact that some areas remain uncovered. The same is applicable to substrates made from heat-resistant polymers such as polyimide or aramid resin.

SUMMARY OF THE INVENTION

As a result of a profound study aimed at a solution of the problems of the prior art, the inventors herein have found that if a thin silica type glass layer is formed on the surface of an inorganic substrate by coating the aforementioned substrate with a specific hydrogenpolysiloxane and curing the coating, then it will be possible to obtain a smooth surface even if the inorganic substrate has microscopic irregularities and holes; no cracks will be formed during and after curing; the cured layer will be firmly adhered to the surface of the inorganic substrate, will possess excellent electrical insulating properties, flexibility, and thermal resistance, and will not be subject to changes, deterioration of properties, and deformations even with exposure to high temperatures required for the formation of semiconductor layers, light-emitting layers, positive electrode layers, etc.

In other words, it is an object of the present invention to provide a method of manufacturing an inorganic substrate the surface of which is smoothened by being covered with a thin silica type layer that possesses excellent electric insulating properties, flexibility, and heat resistance, wherein the thin silica type glass layer is free of cracks, tightly adheres to the surface of the inorganic substrate, and can withstand high temperatures used in processes of manufacturing a semiconductor layers, light-emitting layers, positive electrode layers, etc., without changes, deformations, and deterioration of properties.

It is another object of the invention to provide an inorganic substrate with the aforementioned characteristics.

Another object is to provide a coating agent required for the formation of a thin silica type glass layer with the aforementioned characteristics on the surface of an inorganic substrate.

It is a further object to provide a semiconductor device that can be made in the form of a thin film of excellent reliability and durability.

The above objects are achieved by means of the present invention that is formulated in the following items:

[1] A method of manufacturing an inorganic substrate having a thin silica type glass layer of 2 H to 9 H pencil hardness, said method comprising the following first step (1) and second step (2);
(1) coating an inorganic substrate with (A) a cyclic dihydrogenpolysiloxane that is liquid at ambient temperature, has a weight-average molecular weight within the range of 1500 to 1,000,000, and is composed of $H_2SiO_{2/2}$ unit, (B) a hydrogenpolysiloxane that is liquid at a temperature below 120° C., has a weight-average molecular weight within the range of 500 to 1,000,000, and is expressed by the following siloxane unit formula: $[H_2SiO_{2/2}]_x$ $[HSiO_{3/2}]_y$ $[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1), or a mixture of the cyclic dihydrogenpolysiloxane (A) and the hydrogenpolysiloxane (B).
(2) curing the coated cyclic dihydrogenpolysiloxane (A), the coated hydrogenpolysiloxane (B), or the coated mixture of the cyclic dihydrogenpolysiloxane (A) and the hydrogenpolysiloxane (B) to form a thin silica type glass layer of 2 H to 9 H pencil hardness.

[2] A method of manufacturing an inorganic substrate having a thin silica type glass layer of 2 H to 9 H pencil hardness according to [1], wherein the cyclic dihydrogenpolysiloxane (A), the hydrogenpolysiloxane (B) or a mixture of the cyclic dihydrogenpolysiloxane (A) and the hydrogenpolysiloxane (B) is maintained at a temperature below initiation of curing and below 120° C. for increasing flowability thereof, or the cyclic dihydrogenpolysiloxane (A), the hydrogenpolysiloxane (B), or a mixture of the cyclic dihydrogenpolysiloxane (A) and the hydrogenpolysiloxane (B) is diluted in an organic solvent, prior to the first step (1).

[3] A method of manufacturing an inorganic substrate having a thin silica type glass layer of 2 H to 9 H pencil hardness according to [2], wherein the coated cyclic dihydrogenpolysiloxane (A), the coated hydrogenpolysiloxane (B), or the coated mixture of the cyclic dihydrogenpolysiloxane (A) and the hydrogenpolysiloxane (B) is maintained in an uncured state at a temperature below initiation of curing and below 120° C. for evaporating said organic solvent used for dilution, prior to the second step (2).

[4] A method of manufacturing an inorganic substrate having a thin silica type glass layer of 2 H to 9 H pencil hardness according to [1], wherein the curing step may be performed by heating in an atmosphere containing oxygen gas at a temperature above 150° C., heating in an inert gas or vacuum at a temperature above 200° C., irradiating with a high-energy beam, exposing to ozone, exposing to nitrogen suboxide gas, or exposing to wet ammonia gas.

[5] An inorganic substrate having a thin silica type glass layer of 2 H to 9 H pencil hardness, said thin silica type glass layer comprising a cured body of (A) a cyclic dihydrogenpolysiloxane that is liquid at ambient temperature, has a weight-average molecular weight within the range of 1500 to 1,000,000, and is composed of $H_2SiO_{2/2}$ units, (B) a hydrogenpolysiloxane that is liquid at a temperature below 120° C., has a weight-average molecular weight within the range of 500 to 1,000,000, and is expressed by the following siloxane unit formula: $[H_2SiO_{2/2}]_x[HSiO_{3/2}]_y[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1) or a mixture of the cyclic dihydrogenpolysiloxane (A) and the hydrogenpolysiloxane (B).

[6] The inorganic substrate having a thin silica type glass layer according to [5], wherein said inorganic substrate is a metal substrate, a ceramic substrate, or a non-optical glass substrate.

[7] The inorganic substrate having a thin silica type glass layer according to [6], wherein said metal substrate is a thin flexible metal substrate.

[8] The inorganic substrate having a thin silica type glass layer according to [7], wherein said thin flexible metal substrate is a thin stainless steel plate.

[9] A coating agent for an inorganic substrate comprising: (A) a cyclic dihydrogenpolysiloxane that is liquid at ambient temperature, has a weight-average molecular weight within the range of 1500 to 1,000,000, and is composed of $H_2SiO_{2/2}$ units; (B) a hydrogenpolysiloxane that is liquid at a temperature below 120° C., has a weight-average molecular weight within the range of 500 to 1,000,000, and is expressed by the following siloxane unit formula: $[H_2SiO_{2/2}]_x[HSiO_{3/2}]_y[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1); a mixture of said cyclic dihydrogenpolysiloxane (A) and said hydrogenpolysiloxane (B); or, an organic solvent solution of said cyclic dihydrogenpolysiloxane (A), said hydrogenpolysiloxane (B) or said mixture.

[10] A semiconductor device produced by forming at least a semiconductor layer on said thin silica type glass layer of the inorganic substrate having a thin silica type glass layer of [5].

[11] The semiconductor device according to [10], wherein said inorganic substrate is a thin flexible metal substrate.

[12] The semiconductor device according to [11], wherein said thin flexible metal substrate is a thin stainless steel plate, and said semiconductor layer is a thin silicon semiconductor layer or a thin compound semiconductor layer.

[13] The semiconductor device according to [12], wherein said semiconductor device is a thin solar battery.

The method of the present invention makes it possible to produce with high efficiency and accuracy an inorganic substrate of which surface is smoothened with a thin silica type glass layer of 2 H to 9 H pencil hardness that possesses electrical insulating properties, flexibility and excellent heat-resistant properties, is free of cracks, tightly adheres to the surface of the aforementioned inorganic substrate, and does not deform, change or deteriorate properties even when it is exposed to high temperatures used in manufacturing of semiconductor layers, light-emitting layers, positive electrode layers, or the like.

The inorganic substrate of the present invention has a surface which is smoothened with a thin silica type glass layer of 2 H to 9 H pencil hardness that possesses electrical insulating properties, flexibility and excellent heat-resistant properties, is free of cracks, tightly adheres to the surface of the aforementioned inorganic substrate, and does not deform, change or deterioration properties even when it is exposed to high temperatures used in manufacturing of semiconductor layers, light-emitting layers, positive electrode layers, or the like.

The coating agent of the present invention possesses such properties that allow efficient and precise formation of the aforementioned thin silica type glass layer on the surface of an inorganic substrate.

The semiconductor device of the present invention can be produced in the form of a thin film and is characterized by high reliability and durability since it is formed on the thin silica type glass layer of an inorganic substrate at least as a semiconductor layer.

REFERENCE NUMERALS

1: thin silica type glass layer
2: thin stainless steel plate
3: non-optical glass plate
4: thin semiconductor layer
5a: thin Mo back-side electrode layer
5b: ITO transparent electrode layer
6: thin CdS high-resistance buffer layer
7: thin CIGS-type thin light-absorption layer made from CuInGaSe2
8: thin ZnO semi-insulating layer

BEST MODE FOR CARRYING OUT THE INVENTION

The method of the present invention for manufacturing an inorganic substrate having a thin silica type glass layer of 2 H to 9 H pencil hardness comprises the following first step (1) and second step (2);

(1) coating an inorganic substrate with (A) a cyclic dihydrogenpolysiloxane that is liquid at ambient temperature, has a weight-average molecular weight within the range of 1500 to 1,000,000, and is composed of $H_2SiO_{2/2}$ units, (B) a hydrogenpolysiloxane that is liquid at a temperature below 120° C., has a weight-average molecular weight within the range of 500 to 1,000,000, and is expressed by the following siloxane unit formula: $[H_2SiO_{2/2}]_x[HSiO_{3/2}]_y[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1), or a mixture of the cyclic dihydrogenpolysiloxane (A) and the hydrogenpolysiloxane (B).

(2) curing the coated cyclic dihydrogenpolysiloxane (A), the coated hydrogenpolysiloxane (B) or the coated mixture of the cyclic dihydrogenpolysiloxane (A) and the hydrogenpolysiloxane (B) to form a thin silica type glass layer of 2 H to 9 H pencil hardness.

The cyclic dihydrogenpolysiloxane (A), the hydrogenpolysiloxane (B) or a mixture of the cyclic dihydrogenpolysiloxane (A) and the hydrogenpolysiloxane (B), if necessary, is maintained at a temperature below initiation of curing and below 120° C., for increasing flowability thereof or is diluted in an organic solvent prior to coating in the first step (1).

The coated cyclic dihydrogenpolysiloxane (A), the coated hydrogenpolysiloxane (B) or the coated mixture of the cyclic dihydrogenpolysiloxane (A) and the hydrogenpolysiloxane (B), if necessary, is maintained in an uncured state at a temperature below initiation of curing and below 120° C., for evaporating said organic solvent used for dilution prior to curing in the second step (2).

Cyclic dihydrogenpolysiloxane (A) that is liquid at ambient temperature, has a weight-average molecular weight within the range of 1500 to 1,000,000, and is composed of $H_2SiO_{2/2}$ is selected for use in the method of the present invention for forming a coated inorganic substrate, since it can be applied as a coating even without dissolving it in an organic solvent, can produce a coating layer with a smooth surface, and forms a hard silica type glass layer free of cracks when cured by heating in an atmosphere containing oxygen gas.

In the context of the present invention, the term "inorganic substrate of the present invention" does not cover inorganic substrates for optical application. The present invention is limited to manufacture of non-optical inorganic substrates with a thin silica type glass layer of 2 H to 9 H pencil hardness because a method of manufacturing optical substrates composed of quartz or fluorite, or another transparent optical material coated with a thin silica type glass layer of 2 H to 9 H pencil hardness is a subject matter of earlier JP patent application No. 2005-228774 filed by the present applicant.

From the standpoint of the ease of production, the upper limit of the weight-average molecular weight of the aforementioned cyclic dihydrogenpolysiloxane is preferably 100,000. The weight-average molecular weight is determined by dissolving a sample of the cyclic dihydrogenpolysiloxane in a 2 wt. % chloroform and measuring the sought characteristic by gel permeation chromatography (GPC) with reference to polystyrene as a standard. From a viewpoint of coating technique, it is recommended that the cyclic dihydrogenpolysiloxane (A) has a viscosity preferably below 10,000 mPa·s, more preferably below 5,000 mPa·s at a temperature below 120° C.

The cyclic dihydrogenpolysiloxane (A) can be easily produced by subjecting dihydrogendichlorosilane ($H_2SiCl_2$) to hydrolysis and condensation in a mixture of water with a non-polar organic solvent. A non-polar organic solvent suitable for the above purpose can be exemplified by an aromatic hydrocarbon-type organic solvent and an aliphatic hydrocarbon-type organic solvent. Examples of the aromatic hydrocarbon-type organic solvent are toluene and xylene, and examples of the aliphatic hydrocarbon-type organic solvent are hexane, heptane, octane, and cyclohexane.

A hydrolysis and condensation reaction can be carried out by gradually adding a solution of the dihydrogenchlorosilane dropwise to a mixture of a non-polar organic solvent with water under stirring conditions of the aforementioned mixture.

In order to prevent evaporation of the dihydrogendichlorosilane, the dropwise addition thereof should be carried out at a temperature below 5° C. After hydrolysis and condensation of the dihydrogendichlorosilane in a non-polar organic solvent phase and aqueous phase, the obtained non-polar organic solvent layer that contains the cyclic dihydrogenpolysiloxane is washed with water and dried, and then the non-polar organic solvent and the volatile cyclic dihydrogenpolysiloxane are removed via distillation.

When, after completion of the aforementioned dropwise addition, the product is left at rest, the water layer and the non-polar solvent layer are separated, so that the non-polar organic solvent layer can be removed and washed with water. Washing is carried out till the state of neutrality, or until chlorine ions become undetectable. The product is then washed with water to some extent, neutralized with a weak alkali, such as calcium carbonate, sodium carbonate, or sodium bicarbonate, and the obtained salt is removed by washing with water.

There are no special restrictions with regard to a method that can be used for drying the washed non-polar organic solvent, provided that drying does not modify the cyclic dihydrogenpolysiloxane. However, in case of drying with the use of a powdered or granulated dehydrating agent, such as anhydrous magnesium sulfate, anhydrous sodium sulfate, a molecular sieve, etc., and stir the product to remove the dehydrating agent by filtering. Another example of a drying process is blowing with a dried nitrogen gas with heating and under a reduced pressure, provided that this process does not change properties of the cyclic dihydrogenpolysiloxane. In this case, the volatile cyclic dihydrogenpolysiloxane may be in the form from a trimer to pentadecamer.

The fact that the product is a cyclic dihydrogenpolysiloxane can be confirmed by the absence of absorption of silanol groups in FT-IR analysis.

Component (B) used in the method of the present invention is a hydrogenpolysiloxane that is liquid at a temperature below 120° C., has a weight-average molecular weight within the range of 500 to 1,000,000, and is expressed by the following siloxane unit formula: $[H_2SiO_{2/2}]_x$ $[HSiO_{3/2}]_y$ $[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and $x+y+z=1$).

Since this component may be applied as a thin-film coating even without dissolving in an organic solvent, has a smooth surface on the coating, and is able to form a crack-free hard thin silica-type glass layer when cured by heating in an atmosphere containing oxygen gas, it is suitable for forming thin silica-type glass layers on inorganic substrates. From the viewpoint of ease of manufacturing, it is recommended that this hydrogenpolysiloxane has the upper limit of the weight-average molecular weight at about 100,000.

The weight-average molecular weight is determined by preparing a 2 wt. % chloroform solution of a sample and measuring the sought characteristic by gel permeation chromatography (GPC) with reference to polystyrene as a standard.

It is recommended that at a temperature below 120° C. the hydrogenpolysiloxane (B) has a viscosity below 10,000 mPa·s.

In case in the siloxane unit formula: $[H_2SiO_{2/2}]_x$ $[HSiO_{3/2}]_y$ $[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and $x+y+z=1$) z is 0, this siloxane unit formula can be written as follows: $[H_2SiO_{2/2}]_x$ $[HSiO_{3/2}]_y$ (where x and y express mole concentrations and where the following conditions are observed: $0.12 \leq x < 1.0$; $0 \leq y \leq 0.88$; and $x+y=1$).

When in this formula the value of x is small, this may lead to an increase in the degree of branching and, hence, to occurrence of cracks during curing. Therefore, it is recommended to satisfy the following condition: $0.15 \leq x < 1.0$, $0 < y \leq 0.85$.

If y=0, the siloxane unit formula can be written as follows: $[H_2SiO_{2/2}]_x [SiO_{4/2}]_z$ (where x and z express mole concentrations and where the following conditions are observed: $0.12 \leq x < 1.0$; $0 \leq z \leq 0.30$; and $x+z=1$).

When in this formula the value of x is small, this may lead to an increase in a degree of branching and, hence, to occurrence of cracks in curing. Therefore, it is recommended to satisfy the following condition: $0.15 \leq x < 1.0$. High value of z also may cause cracking and curing, and therefore the following condition should be observed: $0 < z \leq 0.15$.

The aforementioned hydrogenpolysiloxane (B) has the aforementioned siloxane unit formulas in the molecule in mole fractions of x, y, and z on average, which does not imply an arrangement in the order of the aforementioned siloxane units. There may be cases, in which siloxane units are arranged randomly in the molecule, and there may be cases, in which some block portions are present, but the rest of the units are arranged in a random fashion in the molecule.

Since $[H_2SiO_{2/2}]$ units are always present, there may be linear blocks, but because there are always $[HSiO_{3/2}]$ units and/or $[SiO_{4/2}]$ units, the molecular structure is at least branched and may be network-or cage-like as well, i.e. it could be a resin. The presence of $[SiO_{4/2}]$ groups will further increase a degree of branching.

The aforementioned hydrogenpolysiloxane (B) is liquid at temperatures below 120° C. However, in order to facilitate formation of a thin-film coating, it is recommended to keep component (B) at a viscosity of 1 to 10,000 mPa·s. The greater is the amount of $[H_2SiO_{2/2}]$ units in a molecule, the easier to maintain a liquid state and low viscosity. An increase in the amount of $[HSiO_{3/2}]$ units and $[SiO_{4/2}]$ units leads to an increase in the viscosity of component (B) and may lead to the formation of a solid state, but at temperatures above 120° C. the solid state will not be obtained. Since at a temperature below 120° C. the silicon-bonded hydrogen atoms of the hydrogenpolysiloxane cannot be dissociated and separated, even if this component is in a solid state, it can be easily melted by heating.

The aforementioned hydrogenpolysiloxane (B) can be easily produced by subjecting (a) dihydrogendichlorosilane ($H_2SiCl_2$), (b) hydrogentrichlorosilane ($HSiCl_3$), (c) tetraalkoxysilane ($Si(OR)_4$), or tetrachlorosilane ($SiCl_4$) to co-hydrolyis and condensation in a mixture of a non-polar organic solvent, hydrochloric acid, and ionic surface-active agent, the components (a), (b), and (c) being used in such mole concentrations that ensure the following conditions: $0.12 \leq a < 1.0$; $0 \leq b \leq 0.88$; $0 \leq c \leq 0.30$; b and c cannot be concurrently equal to 0; and $(a)+(b)+(c)=1$); the obtained non-polar organic solution layer that contains the hydrogenpolysiloxane being washed with water and dried, with subsequent evaporation of the non-polar organic solvent and volatile hydrogenpolysiloxane. In the above formulae, R is an alkyl group, preferably ethyl group, and can be methyl group, or propyl group as well.

Hydrogenpolysiloxane (B) represented by siloxane units $[H_2SiO_{2/2}]_x [HSiO_{3/2}]_y$ (where x and y express mole concentrations and where the following conditions are observed: $0.12 \leq x < 1.0$; $0 \leq y \leq 0.88$; and $x+y=1$) can be produced by co-hydrolyzing (a) dihydrogendichlorosilane ($H_2SiCl_2$) and (b) hydrogentrichlorosilane ($HSiCl_3$). Hydrogenpolysiloxane (B) represented by siloxane units $[H_2SiO_{2/2}]_x [SiO_{4/2}]_z$ (where x and z express mole concentrations and where the following conditions are observed: $0.12 \leq x < 1.0$; $0 \leq z \leq 0.30$; and $x+z=1$) can be produced by co-hydrolyzing (a) dihydrogendichlorosilane ($H_2SiCl_2$) and (c) tetraalkoxysilane ($Si(OR)_4$) or tetrachlorosilane ($SiCl_4$).

The hydrochloric acid used in the method of the present invention should preferably comprise a concentrated hydrochloric acid, and even more preferably, a hydrochloric acid that contains 15 to 37 wt. % of hydrogen chloride. Since water that is contained in the hydrochloric acid participates in hydrolysis of dihydrogendichlorosilane ($H_2SiCl_2$) (a), hydrogentrichlorosilane ($HSiCl_3$) (b), and tetraalkoxysilane ($Si(OR)_4$) or tetrachlorosilane ($SiCl_4$) (c), the hydrochloric acid should be added in an amount exceeding the equivalent amount required for hydrolysis of the components dihydrogendichlorosilane ($H_2SiCl_2$) (a), hydrogentrichlorosilane ($HSiCl_3$) (b), and tetraalkoxysilane ($Si(OR)_4$) or tetrachlorosilane ($SiCl_4$) (c).

The ionic surface-active agent prohibits formation of gel at rapid hydrolysis and condensation or only condensation of the hydrogenpolysiloxane and accelerates co-hydrolysis and condensation of the hydrogenpolysiloxane.

The ionic surface-active agent may comprise an anionic surface-active agent and cationic surface-active agent, or an amphoteric surface-active agent.

The anionic surface-active agent may be represented by an alkali metal salt of an aliphatic hydrocarbon sulfonic acid such as an alkali metal salt of an alkylsulfonic acid having 6 to 20 carbon atoms and an alkali metal salt of an alkenylsulfonic acid having 6 to 20 carbon atoms; an alkali salt of an alkylbenzenesulfonic acid; an aliphatic hydrocarbon sulfonic acid such as an alkylsulfonic acid having 6 to 20 carbon atoms, an alkenylsulfonic acid having 6 to 20 carbon atoms, and an alkylbenzenesulfonic acid; an alkali metal salt of an alkylsulfonic acid ester; and an alkali metal salt of a higher fatty acid. Sodium and potassium are preferable as the alkali metal.

The cationic surface-active agents can be represented by tetra-ammonium salts, such as tetramethylammonium chloride, benzyltributylammonium chloride, cetyltrimethylammonium chloride, tetrabutylammonium chloride; alkylamine hydrochloride, such as dodecylamine hydrochloride. It is recommended to use the anionic surface-active agents in an amount of 0.01 to 50 wt. %, preferably 0.1 to 1.0 wt. % of water contained in the hydrochloric acid.

The hydrolysis and condensation reaction should be carried out by adding a non-polar organic solvent solution that contains the dihydrogendichlorosilane and hydrogentrichlorosilane, or a non-polar organic solvent solution that contains the dihydrogendichlorosilane and hydrogentrichlorosilane, and tetraalkoxysilane or tetrachlorosilane dropwise to a mixture of the non-polar organic solvent, the hydrochloric acid, and the anionic surface-active agent.

During dropwise addition of the non-polar organic solvent solution, the mixture is maintained under stirring conditions. In order to prevent evaporation of the dihydrogendichlorosilane, hydrogentrichlorosilane, and tetraalkoxysilane, or tetrachlorosilane, it is recommended to conduct the hydrolysis and condensation reaction at a temperature equal to or below 5° C.

Hydrogenpolysiloxane (B) used in the present invention and represented by siloxane unit formula: $[H_2SiO_{2/2}]_v [HSiO_{3/2}]_w$ (where v and w express mole concentrations and where the following conditions are observed: $0.12 \leq v < 1.0$; $0 \leq w \leq 0.88$; and $v+w=1$) can be easily produced by hydrolyzing and condensing the dihydrogendichlorosilane in a mixture of water with the non-polar inorganic solvent, and subsequently by branching the resulting dihydrogenpolysiloxane by mixing the non-polar solvent solution that contains the resulting dihydrogenpolysiloxane with an inorganic acid and a protonic polar solvent.

The inorganic acid suitable for the aforementioned reaction is a sulfuric acid, hydrochloric acid, nitric acid, and phosphoric acid, of which sulfuric acid is preferable. The protonic polar solvent can be exemplified by an alcohol and an aliphatic carboxylic acid, but if the number of carbon atoms is large, in many cases it would be difficult to provide a liquid state. Therefore, it is recommended to use alcohols with the number of carbon atoms lower than 10 and to use the aliphatic carboxylic acid with the number of carbon atoms not exceeding 5. Examples of such solvents are an ethyl alcohol, methyl alcohol, propyl alcohol, acetic acid, and propionic acid.

Hydrolysis and condensation of the dihydrogendichlorosilane that is to be carried out in a mixture of water with the non-polar organic solvent can be performed in the same manner as described above.

Mixing of the inorganic acid, protonic polar solvent, and the non-polar organic solvent that contains the resulting dihydrogenpolysiloxane is carried out at room temperature for about 3 to 5 hours.

Upon completion of the reaction, a layer of the non-polar organic solvent that contains the resulting dihydrogenpolysiloxane is separated, the product is washed with water, and dried, and then the non-polar organic solvent and the volatile dihydrogenpolysiloxane and/or hydrogenpolysiloxane are removed by distillation.

Separation, washing, drying, and removing of the non-polar organic solvent and volatile dihydrogenpolysiloxane and/or hydrogenpolysiloxane are carried out in the same manner as described above. The protonic polar solvent is removed simultaneously with distillation of the non-polar organic solvent and volatile dihydrogenpolysiloxane and/or hydrogenpolysiloxane.

If the cyclic dihydrogenpolysiloxane (A), the hydrogenpolysiloxane (B) or a mixture of the cyclic dihydrogenpolysiloxane (A) and the hydrogenpolysiloxane (B) has high viscosity, in order to facilitate coating, it is preferably diluted with an organic solvent. If the hydrogenpolysiloxane (B) is solid, it is solved in an organic solvent, or is maintained at a temperature below initiation of curing and below 120° C., in order to facilitate coating.

In particular, dilution in an organic solvent is preferable when it is necessary to obtain a thin silica-type glass layer having a micron-order thickness.

The organic solvent suitable for this purpose may be exemplified by toluene, xylene, hexene, ethylbenzene, or similar aromatic hydrocarbons; cyclohexane, methyl cyclohexane, hexane, pentane, octane, 2,2,4-trimethylpentane, decane, or similar aliphatic hydrocarbons; dichloromethane, chloroform, or similar halogen-containing hydrocarbons; methylethylketone, methylisobutylketone, or similar aliphatic ketones; butylether, tetrahydrofuran, 2-methyltetrahydrofuran, or similar aliphatic ethers; methylacetate, γ-butyrolactone, n-propyl acetate, ethyl acetoacetate, ethyleneglycol monomethyl ester acetate, diethyl oxalate, methyl lactate, ethyl lactate, or similar ester-type organic solvents. These solvents can be used individually, or in a mixture of two or three.

Concentration of the cyclic dihydrogenpolysiloxane (A), the hydrogenpolysiloxane (B) or a mixture of the cyclic dihydrogenpolysiloxane (A) and the hydrogenpolysiloxane (B) in the organic solvent used for dilution should be sufficient for providing low viscosity or for dissolving the above components to the condition that allows formation of a thin silica-type glass layer with a micro-order thickness. For the above purpose, the aforementioned concentration should be within the range of 5 to 90 wt. %, preferably, 10 to 50 wt. %.

When the cyclic dihydrogenpolysiloxane (A), the hydrogenpolysiloxane (B), or a mixture of the cyclic dihydrogenpolysiloxane (A) and the hydrogenpolysiloxane (B) which is diluted with an organic solvent or the hydrogenpolysiloxane (B) which is solved in an organic solvent has been coated on an inorganic substrate, it is recommended to evaporate the solvent by maintaining it in an uncured state at a temperature below initiation of curing and below 120° C., for evaporating said organic solvent used for dilution prior to curing.

The ratio of the cyclic dihydrogenpolysiloxane (A) and the hydrogenpolysiloxane (B) in the mixture of them is not limited, but is preferably 99:1 to 1:99, and more preferably 10:90 to 90:10.

The coating agent that is applied onto the inorganic substrate of the present invention is selected from the following:

a cyclic dihydrogenpolysiloxane (A) per se that is liquid at ambient temperature, has a weight-average molecular weight within the range of 1500 to 1,000,000, and is composed of $H_2SiO_{2/2}$ units;

a hydrogenpolysiloxane (B) per se that is liquid at a temperature below 120° C., has a weight-average molecular weight within the range of 500 to 1,000,000, and is expressed by the following siloxane unit formula: $[H_2SiO_{2/2}]_x$ $[HSiO_{3/2}]_y$ $[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1);

a mixture of the cyclic dihydrogenpolysiloxane (A) and the hydrogenpolysiloxane (B);

a solution of the cyclic dihydrogenpolysiloxane (A) obtained by diluting the cyclic dihydrogenpolysiloxane (A) in an organic solvent;

a solution of the hydrogenpolysiloxane (B) obtained by diluting the hydrogenpolysiloxane (B) with an organic solvent or dissolving it in an organic solvent;

a solution of a mixture of the cyclic dihydrogenpolysiloxane (A) and the hydrogenpolysiloxane (B) obtained by diluting it with an organic solvent or dissolving it in an organic solvent.

In case if cyclic dihydrogenpolysiloxane (A) is a viscous liquid at room temperature, the use thereof in the form of a solution is preferable. The same relates to hydrogenpolysiloxane (B) if the latter is a viscous liquid or a solid body at room temperature.

The solvents and concentrations of the cyclic dihydrogenpolysiloxane (A), the hydrogenpolysiloxane (B), or a mixture of the cyclic dihydrogenpolysiloxane (A) and the hydrogenpolysiloxane (B) in the organic solutions are the same as described earlier. The ratio of the cyclic dihydrogenpolysiloxane (A) and the hydrogenpolysiloxane (B) in the mixture of them is not limited, but is preferably 99:1 to 1:99, and more preferably 10:90 to 90:10.

If cyclic dihydrogenpolysiloxane (A) that is liquid at ambient temperature has a weight-average molecular weight within the range of 1500 to 1,000,000 and is composed of $H_2SiO_{2/2}$ units, hydrogenpolysiloxane (B) that is liquid at a temperature below 120° C., has a weight-average molecular weight within the range of 500 to 1,000,000, and is expressed by the following siloxane unit formula: $[H_2SiO_{2/2}]_x$ $[HSiO_{3/2}]_y$ $[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1) or a mixture of the cyclic dihydrogenpolysiloxane (A) and the hydrogenpolysiloxane (B) is heated in an atmosphere containing oxygen gas at a temperature above 150° C., the oxidation reaction that occurs in this case converts silicon-bonded hydrogen atoms into hydroxyl groups, while the dehydration and condensation reaction with the silicon-bonded hydrogen atoms cause cross-linking. In other words, cross-linking and curing occur with the formation of SiOSi bonds.

Such a reaction is also an ozone-inducing reaction that may be intensified than under the effect of oxygen gas contained in air. Occurrence of this reaction in pure inert gas or with heating to a temperature above 200° C. in vacuum causes redistribution of molecules and initiates cross-linking and curing. In wet ammonia gas, silicon-bonded hydrogen atoms are activated, easily react with moisture of air, and form hydroxyl groups. This, in turn, causes a dehydration and condensation reaction with silicon-bonded atoms that result in cross-linking and curing. As a result, silica (silicon oxide) is generated.

Of course, there is no need to consume all silicon-bonded hydrogen atoms contained in molecules of cyclic dihydrogenpolysiloxane (A) and hydrogenpolysiloxane (B), and a part of these hydrogen atoms, e.g., 60 mole % or less, will remain. As the rate of consumption of the silicon-bonded hydrogen atoms increases, i.e., as SiOSi bonds are formed, the hardness of the silica-type glass increases and reaches a pencil hardness of 2 H to 9 H, preferably 4 H to 9 H, and more preferably 7 H to 9 H.

A typical oxygen-containing environment is atmospheric air. Other gases suitable for the purposes of the present invention are nitrogen gas, helium gas or argon gas containing oxygen gas in concentrations smaller than in air. Heating temperature should be higher than 50° C., preferably higher than 200° C., in particular, between 200° C. and 500° C. At 200° C., the heating time should exceed 10 min. and should be shorter at higher temperatures. Heating in pure inert gas or in vacuum at temperatures exceeding 200° C. causes redistribution of molecules, cross-linking, and curing. In this case, heating temperature should exceed 200° C. and preferably should be within a range of 300 to 500° C. At 200° C., the heating time should exceed 10 min. and should be shorter at higher temperatures.

Instead of heating in an oxygen-containing atmosphere, the cyclic dihydrogenpolysiloxane (A), the hydrogenpolysiloxane (B), or a mixture of the cyclic dihydrogenpolysiloxane (A) and the hydrogenpolysiloxane (B) can be cured by exposure to ozone, nitrogen suboxide gas, or wet ammonia gas.

Examples of ozone suitable for this purpose are pure ozone, ozone-containing air, steam-containing ozone, and ozone-containing nitrogen gas. Any of these gases can be used. Nitrogen suboxide gas may comprise pure nitrogen suboxide gas, air that contains nitrogen suboxide gas, and oxygen gas containing nitrogen suboxide gas. Any of these gases can be used. Wet ammonia gas can be exemplified by gaseous ammonia hydroxide and nitrogen gas that contains steam and ammonia gas. Exposure to ozone, nitrogen suboxide gas, or wet ammonia gas can be conducted with heating. Exposing to ozone, exposing to nitrogen suboxide gas, or exposing to wet ammonia gas can be conducted while heating.

The cyclic dihydrogenpolysiloxane (A), the hydrogenpolysiloxane (B), or a mixture of the cyclic dihydrogenpolysiloxane (A) and the hydrogenpolysiloxane (B) can be cured by irradiating with a high-energy beam, i.e., high-energy radiation. Examples of such high-energy beam, i.e., high-energy radiation are electron beams and X-rays. It is recommended that the amount of irradiation with electron beams is equal to or exceed 3 MGy.

An inorganic substrate of the present invention with a thin silica-type glass layer that has a pencil hardness of 2 H to 9 H, preferably 4 H to 9 H, and more preferably 7 H to 9 H, is free of cracks in the coating layer, has smooth surface of the coating, and possesses excellent heat-resistant and electric-insulating properties can be produced by coating the surface of an inorganic substrate with cyclic dihydrogenpolysiloxane (A) that is liquid at ambient temperature, has a weight-average molecular weight within the range of 1500 to 1,000,000, and is composed of $H_2SiO_{2/2}$ units, with hydrogenpolysiloxane (B) that is liquid at a temperature below 120° C., has a weight-average molecular weight within the range of 500 to 1,000,000, and is expressed by the following siloxane unit formula: $[H_2SiO_{2/2}]_x$ $[HSiO_{3/2}]_y$ $[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and $x+y+z=1$) or with a mixture of the cyclic dihydrogenpolysiloxane (A) and the hydrogenpolysiloxane (B), and curing the cyclic dihydrogenpolysiloxane (A), the hydrogenpolysiloxane (B), or a mixture of the cyclic dihydrogenpolysiloxane (A) and the hydrogenpolysiloxane (B).

If necessary, the cyclic dihydrogenpolysiloxane (A), the hydrogenpolysiloxane (B), or a mixture of the cyclic dihydrogenpolysiloxane (A) and the hydrogenpolysiloxane (B) can be maintained at a temperature below initiation of curing and below 120° C. prior to coating for increasing flowability thereof.

The cyclic dihydrogenpolysiloxane (A), the hydrogenpolysiloxane (B), or a mixture of the cyclic dihydrogenpolysiloxane (A) and the hydrogenpolysiloxane (B) can be cured for forming aforementioned thin silica type glass layer specifically by one of the following processes: heating at a temperature above 120° C. in an atmosphere containing oxygen gas, heating in an inert gas or vacuum at a temperature above 200° C., irradiating with a high-energy beam, i.e., high-energy radiation, exposing to ozone, exposing to nitrogen suboxide gas, or exposing to wet ammonia gas.

Durability and physical properties (such as strength and coefficient of thermal expansion) of the thin coating film can be improved if the cyclic dihydrogenpolysiloxane (A), the hydrogenpolysiloxane (B), or a mixture of the cyclic dihydrogenpolysiloxane (A) and the hydrogenpolysiloxane (B) is combined with an inorganic additive. Such an inorganic additive may comprise microscopic inorganic spherical particles, microscopic inorganic tubular particles, microscopic inorganic plate-like particles, etc.

Typical materials for such particles are colloidal silica and colloidal alumina. Combination with the colloidal silica is preferable. When the colloidal silica is added to the cyclic dihydrogenpolysiloxane (A), the hydrogenpolysiloxane (B), or a mixture of the cyclic dihydrogenpolysiloxane (A) and the hydrogenpolysiloxane (B), the colloidal silica should be used in an amount 1 to 100 parts by weight per 100 parts by weight of the cyclic dihydrogenpolysiloxane (A), the hydrogenpolysiloxane (B), or a mixture of the cyclic dihydrogenpolysiloxane (A) and the hydrogenpolysiloxane (B). Since the colloidal silica in fact is a powder, it can be dispersed in an organic solvent that has a boiling point below 200° C. It is recommended that the quantity of the cyclic dihydrogenpolysiloxane (A), the hydrogenpolysiloxane (B), or a mixture of the cyclic dihydrogenpolysiloxane (A) and the hydrogenpolysiloxane (B) and the colloidal silica does not exceed 50 wt. % of the weight of their solvents.

The inorganic substrate used for supporting a thin silica-type glass layer should possess heat-resistant properties sufficient to withstand temperatures above 350° C., preferably above 500° C., and even more preferably, above 700° C., and should have mechanical strength and durability sufficient to withstand stress and deformations that may occur during surface treatment and use.

Typical examples of such substrates are metal plates, ceramic plates, non-optical glass plates, and semiconductor chips. Inorganic substrates such as metal plates, ceramic plates, or non-optical glass plates can be made thick and rigid or thin and flexible. Thin and flexible substrates are required for application in thin-film solar batteries, thin-film transistors (TFT) used in reflection-type liquid crystal displays, and devices and elements used in thin-film electroluminescent displays.

Metal plates and metal foils are preferable from the viewpoint of high mechanical strength. The following are specific examples of metals suitable for such purpose: gold, silver, copper, nickel, titanium, titanium alloys, aluminum, zirconium, steel, in particular, stainless steel, molybdenum steel, etc. The stainless steel foil can be exemplified by ferrite-type stainless steel foil, martensite stainless steel foil, austenite foil, etc. Non-optical glass plates are preferable with respect to transparency.

A thin plate suitable for use as an inorganic substrate should have a thickness between 10 μm and 1 mm, preferably between 20 μm and 100 μm. The thinner the substrate, the higher its flexibility. However, if it is thinner than 10 μm, it becomes inconvenient for handling in view of its extreme flexibility. On the other hand, if the thickness of the substrate is about 1 mm or, in general, exceeds 100 μm, it becomes inflexible and unsuitable for use in thin-film semiconductor devices such as thin-film solar batteries.

There are no special restrictions with regard to the method for coating of the cyclic dihydrogenpolysiloxane (A), the hydrogenpolysiloxane (B), or a mixture of the cyclic dihydrogenpolysiloxane (A) and the hydrogenpolysiloxane (B) onto the inorganic substrate.

This may be spin coating, blade coating, spraying, roller coating, or coating by dipping. The thin silica-type glass layer formed and cured on aforementioned substrate by using the cyclic dihydrogenpolysiloxane (A), the hydrogenpolysiloxane (B), or a mixture of the cyclic dihydrogenpolysiloxane (A) and the hydrogenpolysiloxane (B) normally has a thickness within the range of 0.1 to 10 μm, and for those cases that do not require special flexibility, the thickness may exceed 10 μm, and in extreme cases may be as high as 1 mm.

A thin silica-type glass layer is formed usually on one side of an inorganic substrate, but it can be formed on both sides of an inorganic substrate. An inorganic substrate of which both side are coated with thin silica-type glass layer can be produced by coating one side of an inorganic substrate with the cyclic dihydrogenpolysiloxane (A), the hydrogenpolysiloxane (B), or a mixture of the cyclic dihydrogenpolysiloxane (A) and the hydrogenpolysiloxane (B) by spin coating, blade coating, spraying, or roller coating, heat-curing the coated cyclic dihydrogenpolysiloxane (A), coated the hydrogenpolysiloxane (B), or coated mixture of the cyclic dihydrogenpolysiloxane (A) and the hydrogenpolysiloxane (B), and, subsequently coating another side of the inorganic substrate with the cyclic dihydrogenpolysiloxane (A), the hydrogenpolysiloxane (B), or a mixture of the cyclic dihydrogenpolysiloxane (A) and the hydrogenpolysiloxane (B) by spin coating, blade coating, spraying, or roller coating, heat-curing the coated cyclic dihydrogenpolysiloxane (A), coated the hydrogenpolysiloxane (B), or coated mixture of the cyclic dihydrogenpolysiloxane (A) and the hydrogenpolysiloxane (B).

An inorganic substrate of which both sides are coated with thin silica-type glass layer can be produced by dipping an inorganic substrate into the cyclic dihydrogenpolysiloxane (A), the hydrogenpolysiloxane (B), or a mixture of the cyclic dihydrogenpolysiloxane (A) and the hydrogenpolysiloxane (B), pulling the dipped inorganic substrate up, and heat-curing the coated cyclic dihydrogenpolysiloxane (A), coated the hydrogenpolysiloxane (B), or coated mixture of the cyclic dihydrogenpolysiloxane (A) and the hydrogenpolysiloxane (B).

An inorganic substrate of which both side are coated with thin silica-type glass layer can be produced by spraying cyclic dihydrogenpolysiloxane (A), the hydrogenpolysiloxane (B), or a mixture of the cyclic dihydrogenpolysiloxane (A) and the hydrogenpolysiloxane (B) onto both sides of an inorganic substrate, and heat-curing the sprayed cyclic dihydrogenpolysiloxane (A), the sprayed hydrogenpolysiloxane (B), or sprayed mixture of the cyclic dihydrogenpolysiloxane (A) and the hydrogenpolysiloxane (B).

Since the use of the cyclic dihydrogenpolysiloxane (A), the hydrogenpolysiloxane (B), or a mixture of the cyclic dihydrogenpolysiloxane (A) and the hydrogenpolysiloxane (B) produces an inorganic substrate coated with thin silica-type glass layer having a pencil hardness of 2 H to 9 H, preferably 4 H to 9 H, and more preferably 7 H to 9 H with smooth surface of the coating, the smoothness of which does not exceed 10 nm, and which is characterized by excellent heat-resistant, frost-resistant, and electric insulating properties along with high mechanical strength and resistance to chemicals, a substrate with such a coating is suitable for use in the manufacture of solar batteries, reflection-type liquid crystal displays, electroluminescent displays, etc.

When the aforementioned inorganic substrate is a metal plate of high flexibility, it can be used for the manufacture of thin-film solar batteries, thin-film transistors (TFT) of reflection-type liquid crystal displays, elements or devices of thin-film electroluminescent displays, and thin-film type lithium batteries. A thin glass plate coated with thin silica-type glass layer is suitable for use in the manufacture of thin membrane solar batteries, thin membrane transistor (TFT) for reflection-type liquid crystal displays, electroluminescent displays, etc.

A semiconductor device of the present invention, in particular a thin-film semiconductor device, can be produced by first forming a first thin-film electrode layer on the surface of a thin flexible metal substrate coated with a thin silica-type glass layer comprised of a cured body of the cyclic dihydrogenpolysiloxane (A), the hydrogenpolysiloxane (B), or a mixture of the cyclic dihydrogenpolysiloxane (A) and the hydrogenpolysiloxane (B) with a pencil hardness of 2 H to 9 H, preferably 4 H to 9 H, and more preferably 7 H to 9 H, and then forming a second thin-film electrode layer on the previously applied thin-film silicon semiconductor layer, thus producing a thin-film solar battery.

Alternatively, a thin-film solar battery can be produced by first forming a first thin-film electrode layer on the surface of a thin flexible metal substrate coated with a thin silica-type glass layer comprised of a cured body of the cyclic dihydrogenpolysiloxane (A), the hydrogenpolysiloxane (B), or a mixture of the cyclic dihydrogenpolysiloxane (A) and the hydrogenpolysiloxane (B) with a pencil hardness of 2 H to 9 H, preferably 4 H to 9 H, and more preferably 7 H to 9 H, forming a thin-film compound semiconductor on top of aforementioned first thin-film electrode layer, and then heat-treating the aforementioned thin-film compound semiconductor.

A thin-film transistor can be produced by forming a thin-film amorphous silicon semiconductor on the surface of a thin flexible metal substrate coated with a thin silica-type glass layer comprised of a cured body of the cyclic dihydrogenpolysiloxane (A), the hydrogenpolysiloxane (B), or a mixture of the cyclic dihydrogenpolysiloxane (A) and the hydrogenpolysiloxane (B) with a pencil hardness of 2 H to 9 H, preferably 4 H to 9 H, and more preferably 7 H to 9 H and then heat treating the aforementioned thin film of the amorphous silicon semiconductor.

According to another embodiment, a thin-film electroluminescent element (EL) can be produced by forming a silicon-containing conductive electrode layer on the surface of a thin flexible metal substrate coated with a thin silica-type glass layer comprised of a cured body of the cyclic dihydrogenpolysiloxane (A), the hydrogenpolysiloxane (B), or a mixture of the cyclic dihydrogenpolysiloxane (A) and the hydrogenpolysiloxane (B) with a pencil hardness of 2 H to 9 H, preferably 4 H to 9 H, and more preferably 7 H to 9 H, forming an electrically insulating layer on the aforementioned silicon-containing conductive electrode layer, forming a light-emitting layer on the aforementioned electrically insulating layer, and, finally, conducting heat treatment to obtain the thin-film electroluminescent (EL) element.

Moreover, a positive electrode material of a lithium solar battery can be produced by coating the surface of a thin flexible metal substrate coated with a thin silica-type glass layer comprised of a cured body of the cyclic dihydrogenpolysiloxane (A), the hydrogenpolysiloxane (B), or a mixture of the cyclic dihydrogenpolysiloxane (A) and the hydrogenpolysiloxane (B) with a pencil hardness of 2 H to 9 H, preferably 4 H to 9 H, and more preferably 7 H to 9 H with a thin film of manganese oxide, $LiMn_2O_4$, etc.

The manufacture involves high-temperature processes such as vapor disposition, plasma CVD, spattering, high-temperature heat treatment, etc. Therefore, the flexible thin metal substrate will be exposed to temperatures from 400 to 700° C., but because the coating on the substrate is made from a thin silica-type glass layer being a cured body of the cyclic dihydrogenpolysiloxane (A), the hydrogenpolysiloxane (B), or a mixture of the cyclic dihydrogenpolysiloxane (A) and the hydrogenpolysiloxane (B) with a pencil hardness of 2 H to 9 H, preferably 4 H to 9 H, and more preferably 7 H to 9 H, it will not be subject to change of properties, deterioration of properties, or deformations.

A thin-film semiconductor device, such as a thin-film solar battery, normally can be produced by forming a metal layer, e.g., molybdenum, on a thin metal substrate, forming a thin-film electrode layer, e.g., by photo-etching, and finally forming a thin-film semiconductor layer by photo-etching or laser scribing. The final process may comprise coating of the thin-film semiconductor layer with a transparent conductive film with subsequent formation of a thin-film electrode layer by photo-etching. For this purpose, the thin metal substrate should possess resistance to chemicals and corrosion.

Since the use of a thin-film type solar battery requires that it should possess high flexibility, the thin metal substrate utilized in such a device should possess flexibility. The material suitable for this purpose from the point of view of good thermal conductivity, resistance to chemicals and corrosion may be selected from stainless steel, molybdenum steel, alumina, etc. Stainless steel can be recommended as the material that, in addition to the above-mentioned characteristics, is advantageous in view of its availability and low cost.

The most suitable from these points of view is stainless steel foil. The stainless steel foil can be exemplified by a ferrite-type stainless steel foil, martensite stainless steel foil, and austenite stainless steel foil. Stainless steel foil is preferable for use as a substrate for application of a thin silica-type glass layer being a cured body of aforementioned cyclic dihydrogenpolysiloxane (A), a cured body of aforementioned hydrogenpolysiloxane (B), or cured body of aforementioned mixture of cyclic dihydrogenpolysiloxane (A) and hydrogenpolysiloxane (B) with a pencil hardness of 2 H to 9 H, preferably 4 H to 9 H, and more preferably 7 H to 9 H.

There are no special restrictions with regard to the type of metal from which a metal electrode can be made on the surface of thin silica-type glass layer being a cured body of aforementioned cyclic dihydrogenpolysiloxane (A), a cured body of aforementioned hydrogenpolysiloxane (B), or a cured body of a mixture of the cyclic dihydrogenpolysiloxane (A) and the hydrogenpolysiloxane (B) with a pencil hardness of 2 H to 9 H, preferably 4 H to 9 H, and more preferably 7 H to 9 H. For example, this can be molybdenum, aluminum, gold, silver, copper, iron, tin, etc., or alloys of the above.

Semiconductors suitable for forming semiconductor layers on the surfaces of metal electrodes may comprise polycrystalline silicon semiconductors, single-crystal semiconductors, amorphous silicon semiconductors, or compound semiconductors.

Examples of compound semiconductors are CIS, CdTe, and GICS. Transparent electrodes formed on such semiconductor layers can be made from an alloy of indium oxide and tin, tin oxide, indium oxide, and zinc oxide. If necessary, the transparent electrodes can be coated with protective layers. Materials most suitable for the protective layers are fluoro resin, transparent polyimide, or similar materials of high light transmissivity. High polymer materials are suitable for weather-proof applications.

Thin-film solar batteries produced by the above-described method have flexible substrates that can be bent without forming cracks during production or handling, whereas the thin silica type glass layers are not subject either to formation of cracks or separation from the stainless steel foil. Therefore, such thin-film solar batteries possess excellent productivity, handling properties, and durability. This applies not only to thin-film solar batteries but also to thin-film transistors (TFT) of reflection-type liquid crystal displays, and thin-film semiconductor devices or elements of thin-film electroluminescent displays, thin-film lithium batteries, etc.

EXAMPLES

The invention will be further described more specifically with reference to practical and comparative examples, which, however, should not be construed as limiting the scope of the present invention. If not specified, all processes of dissolving, coating, heating, as well as measurement procedures described in the practical and comparative examples are carried out in the environment of an experiment laboratory. Characteristics used in reference examples were measured under conditions described below.

Viscosity of the cyclic dihydrogenpolysiloxanes or the hydrogenpolysiloxanes was measured by means of an E-model rotary-type viscometer of Tokimec Company at 25° C.

Weight-average molecular weights and molecular weight distribution of the cyclic dihydrogenpolysiloxanes or the hydrogenpolysiloxanes were measured with the use of gel permeation chromatography (GPC). The instruments used for this purpose comprised a refractometer of HLC-8020 gel permeation (GPC) instrument of Tosoh Company and a two-column unit TSKgel GMHXL-L of Tosoh Company. The sample materials were tested with the use of a 2 wt % chloroform solution. Calibration curves were plotted based on polystyrene as a reference with a known molecular weight. All weight-average molecular weights were determined with reference to a polystyrene standard.

$^{29}$Si-NMR and $^{1}$H-NMR of the cyclic dihydrogenpolysiloxanes or the hydrogenpolysiloxanes were measured with the use of a Bruker ACP-300 Spectrometer.

Surface roughness of thin silica-type glass layers, thin stainless steel plates, and non-optical glass substrates were measured with 25 μm scan by using an AFM-DI 5000 Atomic Force Microscope (hereinafter referred to as AFM).

The thickness of thin silica type glass layers was measured in a cross section of the samples with the use of FESEM-JEOL JSM-6335F Field Emission Scanning Electron Microscope.

Pencil hardness of thin silica type glass layers was determined by scratching the surfaces of the films with pencils of different hardness in accordance with 8.4.2 of JIS K5400, and was determined as a maximum hardness that did not produce scratches.

Presence of cracks in the thin silica type glass layers was observed with the use of a KEYENCE VH-7000 electron microscope.

Reference Example 1

Preparation of Hydrogenpolysiloxane Resins A to D

A four-neck glass flask equipped with a stirrer, thermometer, nitrogen gas input port, and a dropping funnel was filled with 1 g of sodium octylsulfonate, 700 ml of toluene, and 200 ml of concentrated hydrochloric acid. While supplying a nitrogen gas flow at a temperature below 5° C. to the flask, a toluene solution of a mixture of dihydrogendichlorosilane and hydrogentrichlorosilane (the following mole ratios were used for dihydrogendichlorosilane and hydrogentrichlorosilane: 12/98 for Resin A; 15/85 for Resin B; 25/75 for Resin C; and 50/50 for Resin D), cooled with dry ice and isopropanol to a temperature below 5° C., was added during 60 min. through the dropping funnel. Upon completion of the dropwise addition, the contents were gradually returned to room temperature, and after 1 hour stirring at room temperature, the organic layer was separated by means of a separating funnel, the product was washed with water until neutrality, and then dried by means of an anhydrous magnesium sulfate powder. The anhydrous magnesium sulfate powder was separated by filtering, the toluene was removed by using a separating funnel, and the residue was dried in vacuum.

The dried residue (hydrogenpolysiloxane resin) was obtained with a yield of 80 to 90% as a colorless transparent liquid, and the molecular weight distribution showed a number of peaks. The values of weight-average molecular weights (Mw), viscosities (mPa·s) and the integrated values of //////the $^{29}$Si-NMR signals corresponding to −50.1 ppm originated by $H_2SiO_{2/2}$ units, −84.5 ppm originated by $HSiO_{3/2}$ units, or the $^{1}$H-NMR signals corresponding to 4.71 ppm originated by $H_2SiO_{2/2}$ units and 4.37 ppm originated by $HSiO_{3/2}$ confirmed that the obtained substances comprised compounds represented by unit formulae shown in Table 1.

Reference Example 2

Preparation of Hydrogenpolysiloxane Resin E

A four-neck glass flask equipped with a stirrer, thermometer, nitrogen gas input port, and a dropping funnel was filled with 1 g of sodium octylsulfonate, 200 ml of toluene, and 200 ml of concentrated hydrochloric acid. While supplying a nitrogen flow into the flask at a temperature from 5° C. to −5° C., a solution mixture of 4.7 g of dihydrogendichlorosilane, 14.2 g of hydrogentrichlorosilane, and 3.2 g of tetraethoxysilane (the following mole ratios were used for dihydrogendichlorosilane, hydrogentrichlorosilane, and tetraethoxysilane: 0.28:0.62:0.10), cooled with dry ice and isopropanol to a temperature below 5° C., was added during 60 min. through the dropping funnel. Upon completion of the dropwise addition, the contents were gradually returned to room temperature, and after 1 hour stirring at room temperature, the organic layer was separated by means of a separating funnel, the product was washed with water until neutrality, and then dried by means of an anhydrous magnesium sulfate powder. The anhydrous magnesium sulfate powder was separated by filtering, the toluene was removed by using a separating funnel, and the residue was dried in vacuum.

The dried residue (hydrogenpolysiloxane resin E was obtained with a yield of 65% as a colorless transparent liquid, and the molecular weight distribution showed a number of peaks. The product had a viscosity of 25,000 mPa·s. The weight-average molecular weight was $27.5 \times 10^3$. The integrated values of the $^{29}$Si-NMR signals corresponding to −50.1 ppm originated by $H_2SiO_{2/2}$ units, −84.5 ppm originated by $HSiO_{3/2}$ units, and −112.5 ppm originated by $SiO_{4/2}$ units, or the $^{1}$H-NMR signals corresponding to 4.71 ppm originated by $H_2SiO_{2/2}$ units and 4.37 ppm originated by $HSiO_{3/2}$ confirmed that the obtained substance comprised a compound represented by the following siloxane unit formula: $(H_2SiO)_{0.28}$ $(HSiO_{1.5})_{0.62}$ $(SiO_{4/2})_{0.10}$. The siloxane unit formula, weight-average molecular weight, and viscosity are shown in Table 1.

Reference Example 3

Preparation of Cyclic Dihydrogenpolysiloxane F

A four-neck glass flask equipped with a stirrer, thermometer, nitrogen gas input port, and a dropping funnel was filled with 1 g of sodium octylsulfonate, 100 ml of toluene, and 50 ml of concentrated hydrochloric acid. While supplying a nitrogen flow into the flask at a temperature from 5° C. to −5° C., a solution mixture of 10 ml of dihydrogendichlorosilane and 10 ml of toluene cooled with dry ice and isopropanol to a temperature below 5° C. was added during 30 min. through the dropping funnel. The reaction mixture was additionally stirred for 30 min, and the reaction temperature was gradually increased to room temperature. After stirring for 30 min. at room temperature, the toluene layer was separated, the product was washed with a saturated brine, an anhydrous sodium sulfate powder was added, the product was dried, the anhydrous sodium sulfate powder was separated by filtering, and a transparent toluene solution was obtained. This toluene solution was stripped at a pressure of $1.0 \times 10^2$ mmHg, the toluene and volatile cyclic dihydrogenpolysiloxane were removed by distillation, and a colorless transparent liquid was obtained.

This liquid as a chloroform solvent was subjected to GPC that showed that a weight-average molecular weight of the tested liquid referenced to the molecular weight of polystyrene was $5.0 \times 10^5$. Viscosity was 800 mPa·s. $^{29}$Si-NMR revealed only the signal of −49.05 ppm originated by $H_2SiO_{2/2}$ units, and $^{1}$H-NMR revealed only the signal of 4.77 ppm originated by signals corresponding to $H_2SiO_{2/2}$ units. The FT-IR measurements also did not reveal silanol groups. The result of measurement showed that the product of hydrolysis and condensation was cyclic dihydrogenpolysiloxane. The siloxane unit formulae, weight-average molecular weights, and viscosities are shown in Table 1.

TABLE 1

Hydrogenpolysiloxanes and Dihydrogenpolysiloxane

| Hydrogenpolysiloxane, Dihydrogenpolysiloxane | Siloxane Unit Formulae | Mw | Viscosity |
|---|---|---|---|
| A | $(H_2SiO)_{0.12}(HSiO_{1.5})_{0.88}$ | $16.0 \times 10^3$ | 55,000 |
| B | $(H_2SiO)_{0.15}(HSiO_{1.5})_{0.85}$ | $12.0 \times 10^3$ | 30,000 |
| C | $(H_2SiO)_{0.25}(HSiO_{1.5})_{0.75}$ | $6.0 \times 10^3$ | 8,000 |
| D | $(H_2SiO)_{0.50}(HSiO_{1.5})_{0.50}$ | $2.0 \times 10^3$ | 1,000 |
| E | $(H_2SiO)_{0.28}(HSiO_{1.5})_{0.62}(SiO_2)_{0.1}$ | $27.5 \times 10^3$ | 25,000 |
| F | $(H_2SiO)$ | $5.0 \times 10^5$ | 800 |

Practical Example 1

Hydrogenpolysiloxane A of Table 1 was dissolved in a dibutyl ether dehydrated by means of molecular sieves until concentration of the aforementioned resin reached 20 wt. %.

The obtained solution was applied by spin coating onto the surface of a thin stainless steel plate, i.e., stainless steel foil having a 24 μm thickness and roughness $R_{max}$ of 56.7 nm (150 mm square shape specimen). The unit was heated for 2 hours at 200° C. and then for 1 hour at 600° C., whereby a thin flexible stainless steel plate having a 0.8 μm-thick thin silica-type glass layer on one side thereof was obtained. Surface roughness on the surface of the thin silica-type glass layer measured by AFM was equal to $R_{max}$ of 6.1 nm. Measurement with FT-IR showed absorption peaks of 2220 cm$^{-1}$ wavelength corresponding to SiH groups.

The silica-type glass layer had a pencil hardness of 9 H and showed electric insulating properties. No cracks or layer separation was observed after both ends of the obtained thin stainless steel plate with the thin silica-type glass coating were grasped by fingers and the substrate was repeatedly bent by 180°. No cracks were observed and the adherence of the thin silica-type glass coating to the stainless steel plate remained strong after this flexible unit was heated for 1 hour at 600° C. in air or nitrogen gas.

Practical Example 2

Hydrogenpolysiloxane B of Table 1 was dissolved in a dibutyl ether dehydrated by means of molecular sieves until concentration of the aforementioned resin reached 10 wt. %.

The obtained solution was applied by dipping coating onto the surface of a thin non-optical glass plate having a 75 μm thickness and roughness $R_{max}$ of 30.6 nm, and the unit was heated for 2 hours at 200° C. and then for 2 hour at 450° C. As a result, a thin flexible glass plate coated on both sides with 1.5 μm-thick thin silica-type glass layers was obtained.

Surface roughness on the surfaces of the thin silica-type glass layers measured by AFM was equal to $R_{max}$ of 1.0 nm.

The silica-type glass layers had a pencil hardness of 9 H and showed electrical insulating properties. No cracks or layer separation was observed after both ends of the obtained thin flexible glass plate were grasped by fingers and bent.

No cracks were observed and the adherence of the thin silica-type glass coating to the thin non-optical glass plate remained strong after this flexible unit was heated for 1 hour at 600° C. in air or nitrogen gas.

Practical Example 3

Hydrogenpolysiloxane D of Table 1 was dissolved in a dibutyl ether dehydrated by means of a molecular sieve until concentration of the aforementioned resin reached 10 wt. %.

The obtained solution was applied by blade coating onto the surface of the same stainless steel plate as the one used in Practical Example 1 (150 mm square shape specimen).

The unit was heated for 2 hours at 200° C., whereby a thin flexible stainless steel plate having a 2.5 μm-thick semicured layer of a hydrogenpolysiloxane D on one side thereof was obtained.

The obtained semicured layer of hydrogenpolysiloxane D was irradiated in nitrogen that contained oxygen in a concentration of 70 ppm with a 200 Mrad electron beam by using an electron-beam emitting device characterized by accelerating voltage of 165 kV.

As a result, a 2.5 μm-thick silica-type glass layer was produced. The obtained layer had strong adhesion to the thin stainless steel plate and did not have any cracks.

No cracks or layer separation was observed after both ends of the obtained flexible thin stainless steel plate with the thin silica-type glass coating were grasped by fingers and the substrate was repeatedly bent by 180°. Since in the infra-red absorption spectrum the heights of absorption peaks at 2200 cm$^{-1}$ wavelength originated from $O_{1.5}SiH$ groups and at 2264 cm$^{-1}$ wavelength originated from $OSiH_2$ groups having absorption characteristics of silicon-bonded hydrogen atoms (SiH) were reduced, it could be assumed that the content of SiH was also reduced by 60%. After 1 hour heating at 500° C., the surface roughness on the thin silica-type glass layer measured by AFM was equal to $R_{max}$ of 10.2 nm. The silica-type glass layer had a pencil hardness of 9 H and showed electrical insulating properties. No cracks were observed and the adherence of the thin silica-type glass coating to the stainless steel plate remained strong after this flexible unit was heated for 1 hour at 600° C. in air or nitrogen gas.

Practical Example 4

Hydrogenpolysiloxane E prepared in Reference Example 2 was dissolved in dibutyl ether dehydrated by means of molecular sieves until concentration of the aforementioned resin reached 20 wt. %.

The obtained solution was applied by blade coating onto the surface of the same thin stainless steel plate that was used in Practical Example 1 (150 mm square shape specimen).

The unit was heated for 12 hours at 200° C., whereby an thin layer of the undercured hydrogenpolysiloxane resin E was formed on one side of the thin stainless steel plate.

The obtained thin stainless steel plate coated with the thin layer of the undercured hydrogenpolysiloxane resin E on one side thereof was inserted into a 30 cm×30 cm polyethylene bag filled with air containing 5 vol. % ammonia, where it was held for 2 hour for curing.

The unit was then heated for 1 hour at 500° C., whereby a 1.5 μm-thick silica-type glass layer was formed on one side thereof.

Measurement under a scanning electronic microscope showed that the surface roughness on the surface of the thin silica-type glass layer was equal to $R_{max}$ of 8.5 nm. Measurement of the thin silica-type glass layer with FT-IR showed absorption peaks of 2220 cm$^{-1}$ wavelength corresponding to SiH groups.

The silica-type glass layer had a pencil hardness of 9 H and showed electric insulating properties. No cracks were observed and the adherence of the thin silica-type glass coating to the stainless steel substrate remained strong after this flexible unit was heated for 1 hour at 600° C. in air or nitrogen gas.

Practical Example 5

Cyclic dihydrogenpolysiloxane F prepared in Reference Example 3 was dissolved in dibutyl ether dehydrated by means of molecular sieves until concentration of the aforementioned resin reached 30 wt. %.

The obtained solution was applied by spin coating onto the surface of the same thin stainless steel plate that was used in Practical Example 1 (150 mm square shape specimen).

The unit was heated for 2 hours at 200° C., whereby a thin layer of the undercured cyclic dihydrogenpolysiloxane F was formed on one side of the thin stainless steel plate.

The obtained thin stainless steel plate coated with thin layer of the undercured cyclic dihydrogenpolysiloxane F on one side thereof was further heated for 2 hours at 500° C., whereby a 0.75 μm-thick silica-type glass layer was formed on one side thereof.

Surface roughness on the thin silica-type glass layer measured by AFM was equal to $R_{max}$ of 6.2 nm. The silica-type glass layer had a pencil hardness of 9 H and showed electrical insulating properties. Measurement of the thin silica-type glass layer with FT-IR showed absorption peaks of 2220 cm$^{-1}$ wavelength corresponding to SiH groups. No cracks were observed and the adherence of the thin silica-type glass coating to the stainless steel substrate remained strong after this flexible unit was heated for 1 hour at 600° C. in air or nitrogen gas.

Practical Example 6

Figure 1:
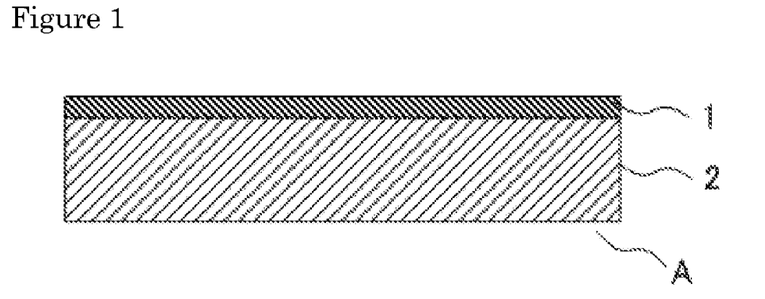
FIG. 1 is a sectional view of a thin stainless steel plate of Practical Example 1, one side of which is coated with a thin silica type glass layer.
Figure 2:
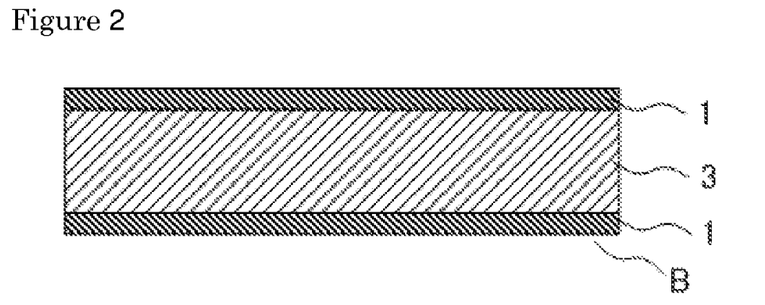
FIG. 2 is a sectional view of a thin non-optical glass plate of Practical Example 2, both sides of which are coated with thin silica type glass layers.
Figure 3:
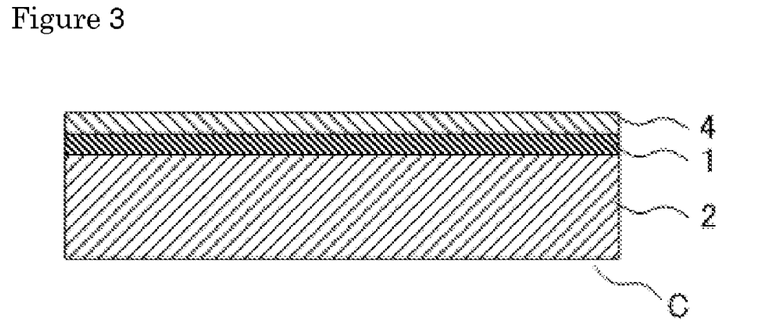
FIG. 3 is a sectional view of a semiconductor device in accordance with an embodiment of the present invention wherein the semiconductor layer is formed on a thin silica type glass layer applied onto one side of a thin stainless steel plate.
Figure 4:
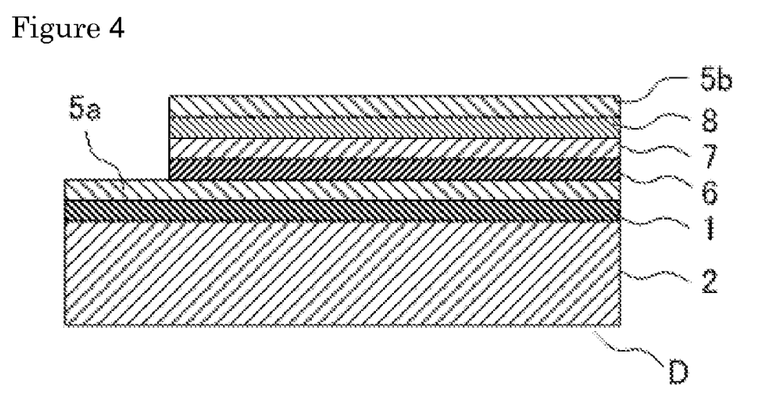
FIG. 4 is a sectional view of a thin-film compound semiconductor type solar battery cell of Practical Example 6.

A solar battery cell of a thin-film compound semiconductor type shown in FIG. 1 was produced by forming the following layers on a thin stainless steel plate coated with a thin silica-type glass layer: a thin back side Mo electrode layer; thin CIGS-type light absorption layer made from CuInGaSe2; CdS high-resistance buffer layer; thin ZnO semi-insulating layer; and thin ITO transparent electrode layer; the aforementioned layers being applied one after another by means of a vapor deposition technique. The obtained thin-film solar battery cell had high light conversion efficiency.

Comparative Example 1

The surface of the 24 μm-thick stainless steel substrate used in Practical 1 and the surface of another similar substrate (150 mm×150 mm specimen) were coated by spraying with an FC-114 Fine Polyimide Varnish of Fine Chemical Japan Co., Ltd., and the coatings were heated for 60 min. at 220° C. to form 1 μm-thick coating films. Heating of these polyimide coating films in air for 1 hour at 600° C. led to formation of pin holes and blackening of the color.

Comparative Example 2

The surface of the 24 μm-thick stainless steel substrate used in Practical 1 and the surface of another similar substrate (150 mm×150 mm specimen) were coated by spin coating with inorganic SOG (SPIN-ON GLASS, trademark OCD-type II) of Tokyo Ohka Kogyo Co., Ltd. to form inorganic SOG coating film. Heating of these coating films for 1 hour at 600° C. developed a plurality of cracks that could be clearly seen with a naked eye.

Comparative Example 3

2 moles of ethyl acetoacetate and 1 mole of tetraethoxytitanium were dispersed in 4 moles of ethanol. 10 moles of tetramethoxysilane were added, and the mixture was stirred. A liquid mixture of 4 moles of ethanol and 2 moles of water were added dropwise, whereby a transparent liquid was produced.

This liquid was applied by spin coating onto the same 24 μm-thick stainless steel plate as the 24 μm-thick stainless steel plate used in Practical 1 (150 mm×150 mm specimen). After heating for 24 hours at 120° C., the coating was dried to form a gel, and then the coating was heated for 3 hours at 200° C., whereby a 0.6 μm-thick cured coating film was formed. Observation of the coating under a scanning electron microscope showed that the coating has a smooth surface and surface roughness $R_a$ not exceeding 0.02 μm. However, heating of this coating film for 1 hour at 600° C. developed a plurality of cracks that could be clearly seen with a naked eye.

INDUSTRIAL APPLICABILITY

The method of the present invention for manufacturing inorganic substrates with thin silica type glass coating layers may be used in the production of solar batteries, reflection-type liquid crystal displays, electroluminescent displays, or similar inorganic substrates for semiconductor devices, especially in the production of thin-film solar batteries, thin-film transistors of reflection-type liquid-crystal displays, elements of thin-film electroluminescent displays, or similar thin-film type semiconductor devices, as well as for the production of inorganic substrates of electrodes used in thin-film lithium batteries, or the like.

The inorganic substrates of the present invention with thin silica-type glass coating layers may be used as substrates for solar batteries, reflection-type liquid crystal displays, electroluminescent displays, or similar inorganic substrates for semiconductor devices, especially as inorganic substrates of thin-film solar batteries, thin-film transistors of reflection-type liquid-crystal displays, elements of thin-film electroluminescent displays, or similar thin-film type semiconductor devices, as well as inorganic substrates of electrodes used in thin-film lithium batteries, or the like.

The coating agent of the present invention can be used for forming thin silica-type glass coating layers possessing such characteristics as electrical insulating properties, flexibility, and excellent resistance to heat on inorganic substrates.

Semiconductor devices of the present invention may find application in solar houses, image-forming equipment, portable telephones, computers, displays, domestic appliances, office automation equipment, automobiles, aircrafts, space satellites, ships, etc.

The invention claimed is:

1. A method of manufacturing an inorganic substrate having a thin silica type glass layer of 2H to 9H pencil hardness, said method comprising the following first step (1) and second step (2);

(1) coating an inorganic substrate with (A) a cyclic dihydrogenpolysiloxane that is liquid at ambient temperature, has a weight-average molecular weight within the range of 1500 to 1,000,000, and is composed of $H_2SiO_{2/2}$ units, (B) a hydrogenpolysiloxane that is liquid at a temperature below 120° C., has a weight-average molecular weight within the range of 500 to 1,000,000, and is expressed by the following siloxane unit formulas: $[H_2SiO_{2/2}]_x [HSiO_{3/2}]_y [SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1) or $[H_2SiO_{2/2}]_v [HSiO_{3/2}]_w$ (where v and w express mole concentrations and where the following conditions are observed: $0.12 \leq v < 1.0$; $0 \leq w \leq 0.88$; and v+w=1) wherein the hydrogenpolysiloxane expressed by the unit formula: $[H_2SiO_{2/2}]_x [HSiO_{3/2}]_y [SiO_{4/2}]_z$ a has been produced by subjecting (a) dihydrogendichlorosilane ($H_2SiCl_2$), (b) hydrogentrichlorosilane (HSiCl$_3$), (c) tetraalkoxysilane (Si(OR)$_4$), or tetrachlorosilane (SiCl$_4$) to co-hydrolyis and condensation in a mixture of a non-polar organic solvent, hydrochloric acid, and ionic surface-active agent, the components (a), (b), and (c) being used in such mole concentrations that ensure the following conditions: $0.12 \leq a < 1.0$; $0 \leq b \leq 0.88$; $0 \leq c \leq 0.30$; b and c cannot be concurrently equal to 0; and (a)+(b)+(c)=1), and the hydrogenpolysiloxane expressed by the unit formula: $[H_2SiO_{2/2}]_v$ $[HSiO_{3/2}]_w$ has been produced by hydrolyzing and condensing dihydrogendichlorosilane in a mixture of water with a non-polar inorganic solvent, and subsequently by branching the resulting dihydrogenpolysiloxane by mixing the non-polar solvent solution that contains the resulting dihydrogenpolysiloxane with an inorganic acid and a protonic polar solvent, or a mixture of the cyclic dihydrogenpolysiloxane (A) and the hydrogenpolysiloxane (B); and (2) curing the coated cyclic dihydrogenpolysiloxane (A), the coated hydrogenpolysiloxane (B), or the coated mixture of the cyclic dihydrogenpolysiloxane (A) and the hydrogenpolysiloxane (B) to form a thin silica type glass layer of 2H to 9H pencil hardness.

2. A method of manufacturing an inorganic substrate having a thin silica type glass layer of 2H to 9H pencil hardness according to claim 1, wherein the cyclic dihydrogenpolysiloxane (A), the hydrogenpolysiloxane (B), or a mixture of the cyclic dihydrogenpolysiloxane (A) and the hydrogenpolysiloxane (B) is maintained at a temperature below initiation of curing and below 120° C. for increasing flowability thereof, or the cyclic dihydrogenpolysiloxane (A), the hydrogenpolysiloxane (B), or a mixture of the cyclic dihydrogenpolysiloxane (A) and the hydrogenpolysiloxane (B) is diluted in an organic solvent, prior to the first step (1).

3. A method of manufacturing an inorganic substrate having a thin silica type glass layer of 2H to 9H pencil hardness according to claim 2, wherein the coated cyclic dihydrogenpolysiloxane (A), the coated hydrogenpolysiloxane (B), or the coated mixture of the cyclic dihydrogenpolysiloxane (A) and the hydrogenpolysiloxane (B) is maintained in an uncured state at a temperature below initiation of curing and below 120° C. for evaporating said organic solvent used for dilution, prior to the second step (2).

4. A method of manufacturing an inorganic substrate having a thin silica type glass layer of 2H to 9H pencil hardness according to claim 1, wherein the curing step may be performed by heating in an atmosphere containing oxygen gas at a temperature above 150° C., heating in an inert gas or vacuum at a temperature above 200° C., irradiating with a high-energy beam, exposing to ozone, exposing to nitrogen suboxide gas, or exposing to wet ammonia gas.

5. An inorganic substrate having a thin silica type glass layer of 2H to 9H pencil hardness, said thin silica type glass layer comprising a cured body of (A) a cyclic dihydrogenpolysiloxane that is liquid at ambient temperature, has a weight-average molecular weight within the range of 1500 to 1,000,000, and is composed of $H_2SiO_{2/2}$ units, (B) a hydrogenpolysiloxane that is liquid at a temperature below 120° C., has a weight-average molecular weight within the range of 500 to 1,000,000, and is expressed by the following siloxane unit formulas: $[H_2SiO_{2/2}]_x$ $[HSiO_{3/2}]_y$ $[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1) or $[H_2SiO_{2/2}]_v$ $[HSiO_{3/2}]_w$ (where v and w express mole concentrations and where the following conditions are observed: $0.12 \leq v < 1.0$; $0 \leq w \leq 0.88$; and v+w=1) wherein the hydrogenpolysiloxane expressed by the unit formula: $[H_2SiO_{2/2}]_x$ $[HSiO_{3/2}]_y$ $[SiO_{4/2}]_z$ has been produced by subjecting (a) dihydrogendichlorosilane ($H_2SiCl_2$), (b) hydrogentrichlorosilane (HSiCl$_3$), (c) tetraalkoxysilane (Si(OR)$_4$), or tetrachlorosilane (SiCl$_4$) to co-hydrolyis and condensation in a mixture of a non-polar organic solvent, hydrochloric acid, and ionic surface-active agent, the components (a), (b), and (c) being used in such mole concentrations that ensure the following conditions: $0.12 \leq a < 1.0$; $0 \leq b \leq 0.88$; $0 \leq c \leq 0.30$; b and c cannot be concurrently equal to 0; and (a)+(b)+(c)=1), and the hydrogenpolysiloxane expressed by the unit formula: $[H_2SiO_{2/2}]_v$ $[HSiO_{3/2}]_w$ has been produced by hydrolyzing and condensing dihydrogendichlorosilane in a mixture of water with a non-polar inorganic solvent, and subsequently by branching the resulting dihydrogenpolysiloxane by mixing the non-polar solvent solution that contains the resulting dihydrogenpolysiloxane with an inorganic acid and a protonic polar solvent, or a mixture of the cyclic dihydrogenpolysiloxane (A) and the hydrogenpolysiloxane (B).

6. The inorganic substrate having a thin silica type glass layer according to claim 5, wherein said inorganic substrate is a metal substrate, a ceramic substrate, or a non-optical glass substrate.

7. The inorganic substrate having a thin silica type glass layer according to claim 6, wherein said metal substrate is a thin flexible metal substrate.

8. The inorganic substrate having a thin silica type glass layer according to claim 7, wherein said thin flexible metal substrate is a thin stainless steel plate.

9. A semiconductor device produced by forming at least a semiconductor layer on said thin silica type glass layer of the inorganic substrate having a thin silica type glass layer of claim 5.

10. The semiconductor device according to claim 9, wherein said inorganic substrate is a thin flexible metal substrate.

11. The semiconductor device according to claim 10, wherein said thin flexible metal substrate is a thin stainless steel plate, and said semiconductor layer is a thin silicon semiconductor layer or a thin compound semiconductor layer.

12. The semiconductor device according to claim 11, wherein said semiconductor device is a thin solar battery.

13. A coating agent for an inorganic substrate comprising: (A) a cyclic dihydrogenpolysiloxane that has been produced by subjecting dihydrogendichlorosilane ($H_2SiCl_2$) to hydrolysis and condensation in a mixture of water with a non-polar organic solvent and removing volatile dihydrogenpolysiloxanes via distillation, is liquid at ambient temperature, has a weight-average molecular weight within the range of 1500 to 1,000,000, and is composed of $H_2SiO_{2/2}$ units; (B) a hydrogenpolysiloxane that is liquid at a temperature below 120° C., has a weight-average molecular weight within the range of 500 to 1,000,000, and is expressed by the following siloxane unit formulas: $[H_2SiO_{2/2}]_x$ $[HSiO_{3/2}]_y$ $[SiO_{4/2}]_z$ (where x, y, and z express mole concentrations and where the following conditions are observed: $0.12 \leq x < 1.0$; $0 \leq y \leq 0.88$; $0 \leq z \leq 0.30$; y and z cannot be concurrently equal to 0; and x+y+z=1) or $[H_2SiO_{2/2}]_v$ $[HSiO_{3/2}]_w$ (where v and w express mole concentrations and where the following conditions are observed: $0.12 \leq v < 1.0$; $0 \leq w \leq 0.88$; and v+w=1) wherein the hydrogenpolysiloxane expressed by the unit formula: $[H_2SiO_{2/2}]_x$ $[HSiO_{3/2}]_y$ $[SiO_{4/2}]_z$ has been produced by subjecting (a) dihydrogendichlorosilane ($H_2SiCl_2$), (b) hydrogentrichlorosilane (HSiCl$_3$), (c) tetraalkoxysilane (Si(OR)$_4$), or tetrachlorosilane (SiCl$_4$) to co-hydrolysis and condensation in a mixture of a non-polar organic solvent, hydrochloric acid, and ionic surface-active agent, the components (a), (b), and (c) being used in such mole concentrations that ensure the following conditions: $0.12 \leqq a < 1.0$; $0 \leqq b \leqq 0.88$; $0 \leqq c \leqq 0.30$; b and c cannot be concurrently equal to 0; and $(a)+(b)+(c)=1$), and the hydrogenpolysiloxane expressed by the unit formula: $[H_2SiO_{2/2}]_v$ $[HSiO_{3/2}]_w$ has been produced by hydrolyzing and condensing dihydrogendichlorosilane in a mixture of water with non-polar inorganic solvent, and subsequently by branching the resulting dihydrogenpolysiloxane by mixing the non-polar solvent solution that contains the resulting dihydrogenpolysiloxane with an inorganic acid and a protonic polar solvent; a mixture of the cyclic dihydrogenpolysiloxane (A) and the hydrogenpolysiloxane (B); or, an organic solvent solution of the cyclic dihydrogenpolysiloxane (A), the hydrogenpolysiloxane (B), or a mixture of the cyclic dihydrogenpolysiloxane (A) and the hydrogenpolysiloxane (B).

* * * * *